US012648259B2

(12) United States Patent
Liu et al.

(10) Patent No.: US 12,648,259 B2
(45) Date of Patent: Jun. 2, 2026

(54) OPTICAL PACKAGE STRUCTURE AND OPTICAL CHIP THEREOF

(71) Applicant: TONG HSING ELECTRONIC INDUSTRIES, LTD., Taipei City (TW)

(72) Inventors: Yu-Hsiang Liu, Taipei City (TW); Li-Chun Hung, Hsin-Chu County (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 361 days.

(21) Appl. No.: 18/581,549

(22) Filed: Feb. 20, 2024

(65) Prior Publication Data

US 2025/0185413 A1 Jun. 5, 2025

(30) Foreign Application Priority Data

Nov. 30, 2023 (TW) .................................. 112146440

(51) Int. Cl.
*H10F 77/50* (2025.01)
*H10F 77/00* (2025.01)

(52) U.S. Cl.
CPC ........... *H10F 77/50* (2025.01); *H10F 77/933* (2025.01)

(58) Field of Classification Search
CPC ...... H10F 77/50; H10F 77/933; H10F 39/804; H10W 90/00
See application file for complete search history.

(56) References Cited

U.S. PATENT DOCUMENTS

| | | | |
|---|---|---|---|
| 9,275,949 B2 | 3/2016 | Okada | |
| 9,691,801 B2 | 6/2017 | Grebet et al. | |
| 10,181,446 B2 | 1/2019 | Dobashi et al. | |
| 2008/0083964 A1* | 4/2008 | Fujimoto | H10F 39/804 |
| | | | 257/E31.127 |
| 2021/0399035 A1* | 12/2021 | Punzalan | H10F 39/011 |
| 2022/0415733 A1* | 12/2022 | Oh | H10W 76/60 |
| 2023/0197744 A1* | 6/2023 | Chang | H10F 39/804 |
| | | | 257/434 |
| 2023/0395634 A1* | 12/2023 | Lee | H10F 39/804 |

FOREIGN PATENT DOCUMENTS

TW I811662 B 8/2023

* cited by examiner

*Primary Examiner* — Mark W Tornow
(74) *Attorney, Agent, or Firm* — Li & Cai Intellectual Property (USA) Office

(57) ABSTRACT

An optical package structure includes a substrate, an optical chip disposed on the substrate, a ring-shaped supporting layer disposed on the optical chip, a light-permeable layer disposed on the ring-shaped supporting layer, and an encapsulant formed on the substrate. The optical chip has a pressure channel arranged therein. Two ends of the pressure channel are respectively arranged on an outer surface of the optical chip and are respectively located at two opposite sides of the ring-shaped supporting layer. The light-permeable layer, the ring-shaped supporting layer, and the optical chip are embedded in the encapsulant and jointly define an air chamber that is in fluid communication with the pressure channel. The encapsulant encloses the pressure channel, and the air chamber is enclosed.

20 Claims, 11 Drawing Sheets

OPTICAL PACKAGE STRUCTURE AND OPTICAL CHIP THEREOF

CROSS-REFERENCE TO RELATED PATENT APPLICATION

This application claims the benefit of priority to Taiwan Patent Application No. 112146440, filed on Nov. 30, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to an optical package structure and an optical chip thereof.

BACKGROUND OF THE DISCLOSURE

A conventional optical package structure includes an optical chip, a light-permeable layer, and a supporting layer that is sandwiched between the optical chip and the light-permeable layer. The optical chip, the light-permeable layer, and the supporting layer jointly define an enclosed space. However, when the conventional optical package structure is manufactured under a high-temperature condition, the heat causes air in the enclosed space to expand, such that the supporting layer is easily deformed.

SUMMARY OF THE DISCLOSURE

In response to the above-referenced technical inadequacies, the present disclosure provides an optical package structure and an optical chip thereof for effectively improving on the issues associated with conventional optical package structures.

In order to solve the above-mentioned problems, one of the technical aspects adopted by the present disclosure is to provide an optical package structure, which includes a substrate, an optical chip disposed on and electrically coupled to the substrate, a ring-shaped supporting layer, a light-permeable layer, and an encapsulant formed on the substrate. Moreover, a top surface of the optical chip includes an optical region, a carrying region surrounding the optical region, an inner spacing region arranged between the optical region and the carrying region, and an outer spacing region that is arranged outside of the carrying region. The optical chip has a pressure channel formed in an interior thereof. One end of the pressure channel has a first entrance that is arranged on the outer spacing region and that has an aperture being within a range from 0.2 μm to 10 μm, and another end of the pressure channel has a second entrance that is arranged on the inner spacing region. The ring-shaped supporting layer is disposed on the carrying region of the optical chip and surrounds the optical region. The light-permeable layer is disposed on the ring-shaped supporting layer. The light-permeable layer, the ring-shaped supporting layer, and the top surface of the optical chip jointly define an air chamber being in fluid communication with the pressure channel. The optical chip, the ring-shaped supporting layer, and the light-permeable layer are embedded in the encapsulant, and an outer surface of the light-permeable layer arranged away from the substrate is at least partially exposed from the encapsulant. The encapsulant encloses the first entrance of the pressure channel and does not extend into the pressure channel, and the air chamber is enclosed.

In order to solve the above-mentioned problems, another one of the technical aspects adopted by the present disclosure is to provide an optical package structure, which includes a substrate, an optical chip disposed on and electrically coupled to the substrate, a ring-shaped supporting layer, a light-permeable layer, and an encapsulant formed on the substrate. The optical chip includes a top surface and a surrounding lateral surface that is connected to a peripheral edge of the top surface. The top surface includes an optical region, a carrying region surrounding the optical region, and an inner spacing region that is arranged between the optical region and the carrying region. The optical chip has a pressure channel formed in an interior thereof. One end of the pressure channel has a first entrance that is arranged on the surrounding lateral surface and that has an aperture being within a range from 0.2 μm to 10 μm, and another end of the pressure channel has a second entrance that is arranged on the inner spacing region. The ring-shaped supporting layer is disposed on the carrying region of the optical chip and surrounds the optical region. The light-permeable layer is disposed on the ring-shaped supporting layer. The light-permeable layer, the ring-shaped supporting layer, and the top surface of the optical chip jointly define an air chamber being in fluid communication with the pressure channel. The optical chip, the ring-shaped supporting layer, and the light-permeable layer are embedded in the encapsulant, and an outer surface of the light-permeable layer arranged away from the substrate is at least partially exposed from the encapsulant. The encapsulant encloses the first entrance of the pressure channel and does not extend into the pressure channel, and the air chamber is enclosed.

In order to solve the above-mentioned problems, yet another one of the technical aspects adopted by the present disclosure is to provide an optical chip of an optical package structure, which includes a top surface and a surrounding lateral surface. The top surface includes an optical region, a carrying region surrounding the optical region, an inner spacing region arranged between the optical region and the carrying region, and an outer spacing region that is arranged outside of the carrying region. The optical chip has a pressure channel formed in an interior thereof. One end of the pressure channel has a first entrance that is arranged on at least one of the outer spacing region and the surrounding lateral surface and that has an aperture being within a range from 0.2 μm to 10 μm, and another end of the pressure channel has a second entrance that is arranged on the inner spacing region.

Therefore, the optical chip of the optical package structure in the present disclosure is formed with the pressure channel having a specific arrangement, so that when manufacturing steps under high temperature conditions are implemented, the ring-shaped supporting layer can be effectively prevented from being affected by the air chamber to avoid deformation, thereby increasing the product yield and reliability of the optical package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
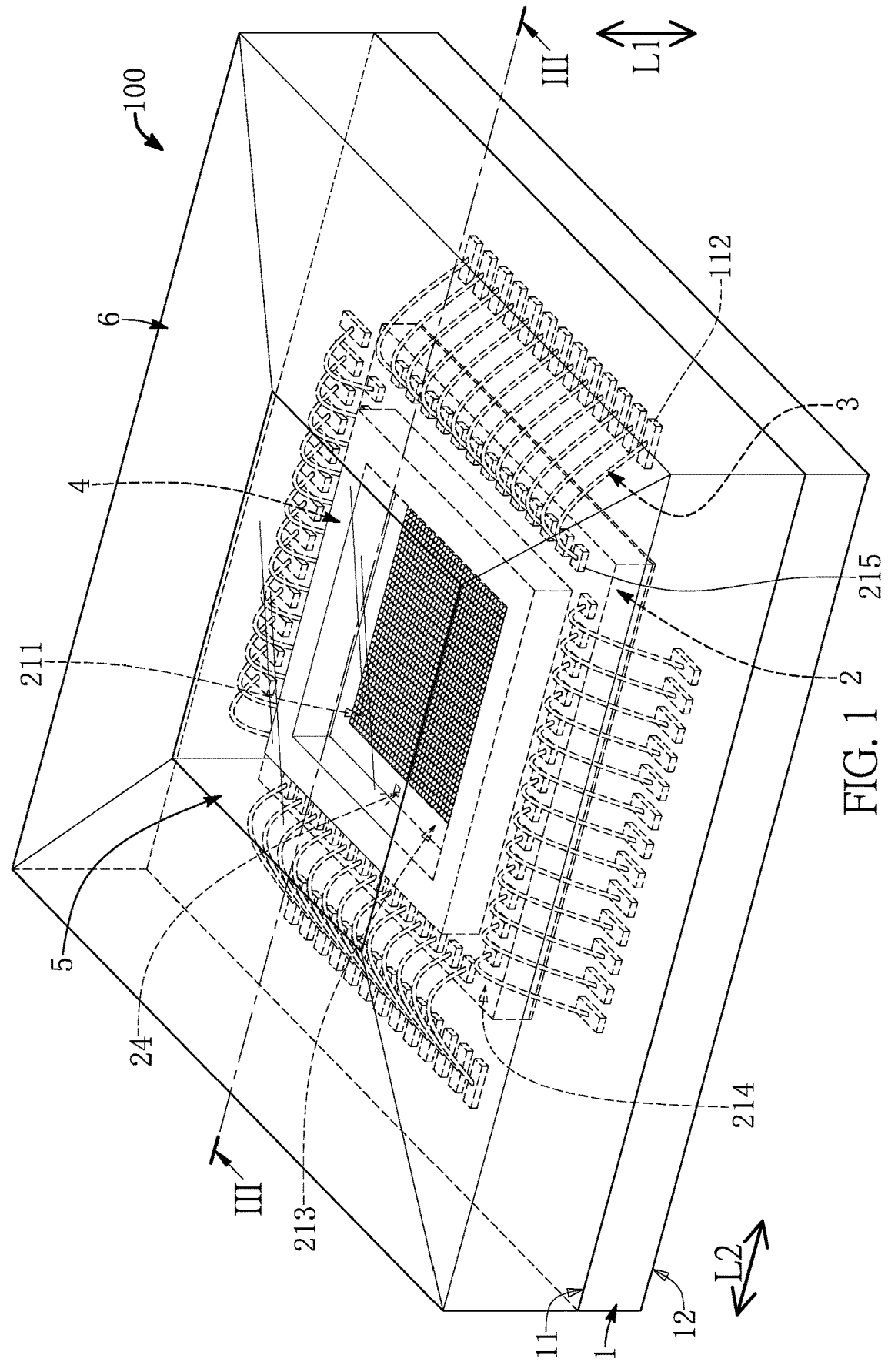
FIG. 1 is a schematic perspective view of an optical package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
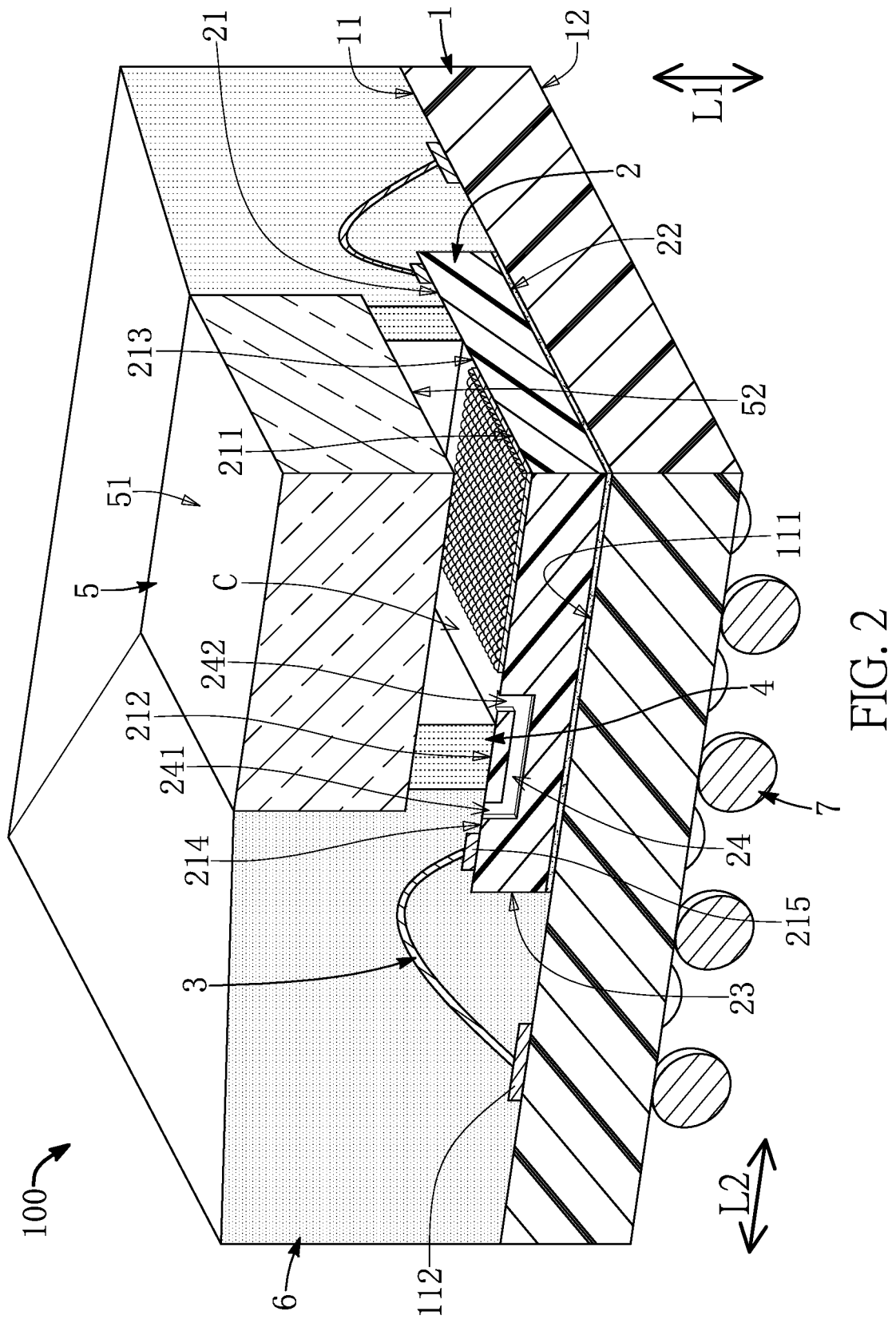
FIG. 2 is a perspective cross-sectional view showing a part of FIG. 1.

Referring to FIG. 1 to FIG. 5, a first embodiment of the present disclosure is provided. As shown in FIG. 1 and FIG. 2, the present embodiment provides an optical package structure 100. It should be noted that, any package structure not encapsulating an optical component therein has a structural design different from that of the optical package structure 100 of the present embodiment.

Figure 3:
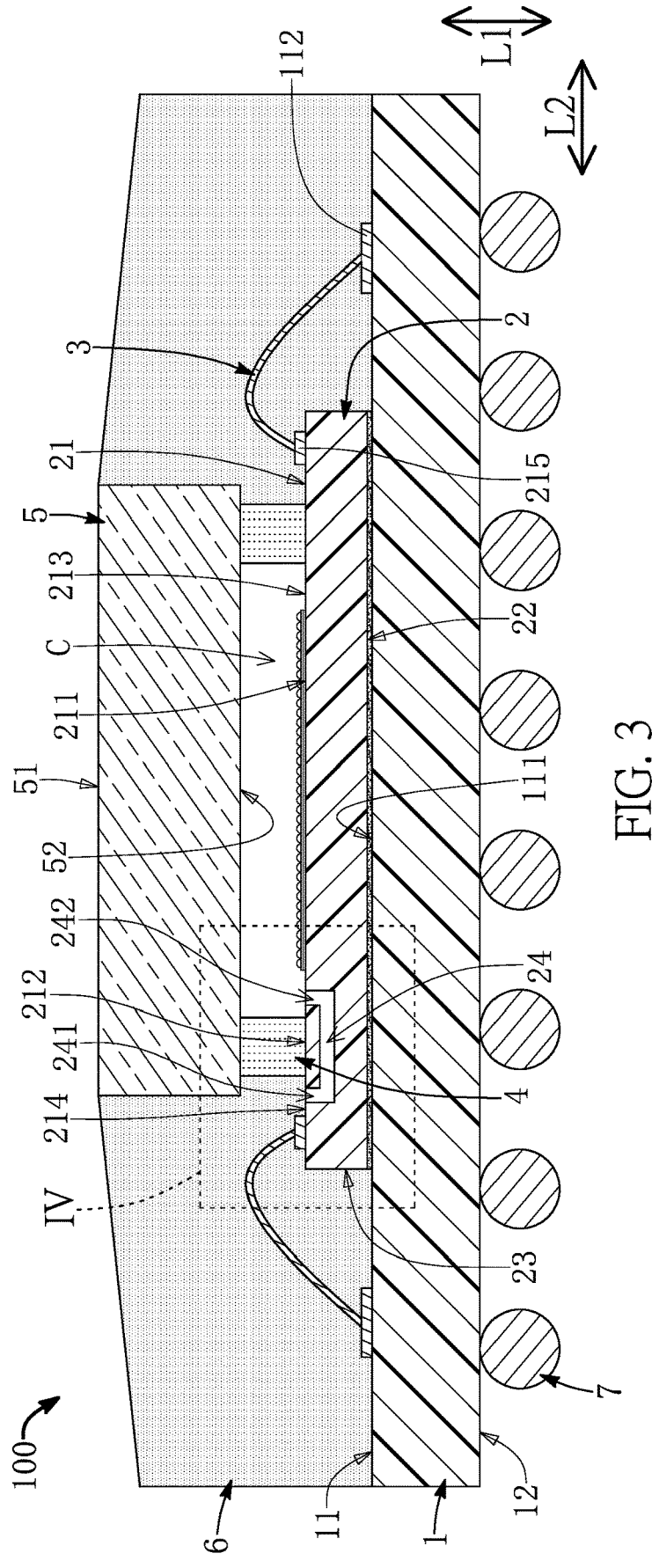
FIG. 3 is a schematic cross-sectional view taken along line III-III of FIG. 1.
Figure 4:
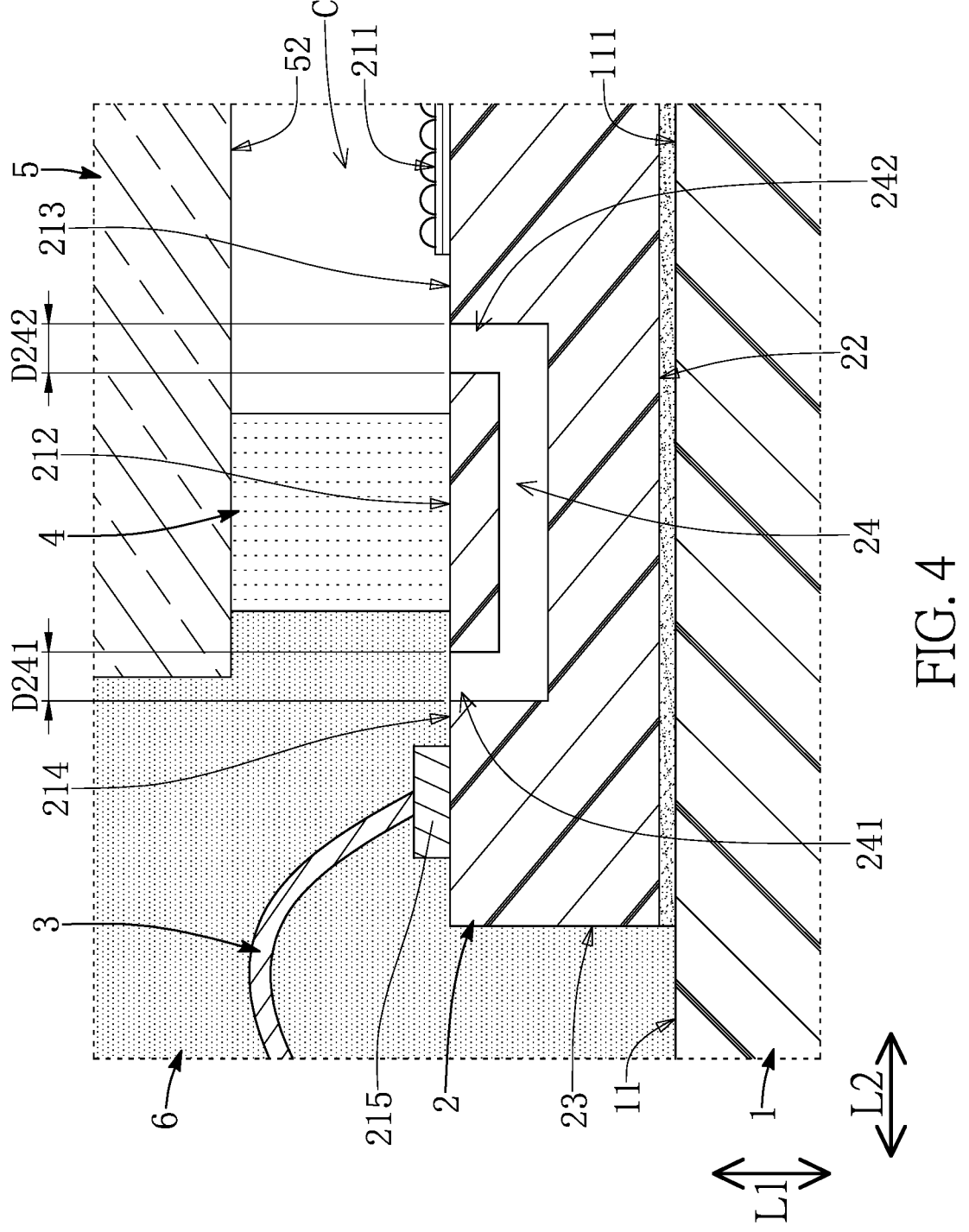
FIG. 4 is a schematic enlarged view of part IV of FIG. 3.

As shown in FIG. 2 to FIG. 4, the optical package structure 100 includes a substrate 1, an optical chip 2 disposed on the substrate 1, a plurality of metal wires 3 electrically coupled to the optical chip 2 and the substrate 1, a ring-shaped supporting layer 4 disposed on the optical chip 2, a light-permeable layer 5 disposed on the ring-shaped supporting layer 4, and an encapsulant 6 that is formed on the substrate 1.

The optical package structure 100 in the present embodiment includes the above components, but can be adjusted or changed according to design requirements. For example, in other embodiments of the present disclosure not shown in the drawings, the optical package structure 100 can be provided without the metal wires 3, and the sensor chip 2 is fixed onto and electrically coupled to the substrate 1 in a flip-chip manner or an adhering manner; or, the optical chip 2 can be independently used (e.g., sold) or can be used in cooperation with other components. The structure and connection relationship of each component of the optical package structure 100 are recited in the following description.

The substrate 1 of the present embodiment has a square shape or a rectangular shape, but the present disclosure is not limited thereto. An upper surface 11 of the substrate 1 includes a chip-bonding region 111 arranged approximately on a center portion thereof, and the substrate 1 includes a plurality of bonding pads 112 that are arranged on the upper surface 11 and outside of the chip-bonding region 111. The bonding pads 112 in the present embodiment are in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

In addition, the substrate 1 can be further provided with a plurality of soldering balls 7 (or solders 7) disposed on a lower surface 12 thereof. The substrate 1 can be soldered onto an electronic component (not shown in the drawings) through the soldering balls 7, thereby electrically connecting the optical package structure 100 to the electronic component.

The sensor chip 2 in the present embodiment has a square shape or a rectangular shape, and is an image sensor chip or a light emitter, but the present disclosure is not limited thereto. A bottom surface 22 of the sensor chip 2 is fixed onto the chip-bonding region 111 of the substrate 1 through a chip-bonding adhesive along a predetermined direction L1. In other words, the sensor chip 2 is arranged to be surrounded on the inside of the bonding pads 112.

Moreover, the sensor chip 2 has a top surface 21 and a surrounding lateral surface 23 that is connected to the top surface 21 and the bottom surface 22 (e.g., the surrounding lateral surface 23 is connected to a peripheral edge of the top surface 21). The top surface 21 of the sensor chip 2 has an optical region 211, a carrying region 212 having a ring shape and being arranged around the sensing region 211, an inner spacing region 213 arranged between the optical region 211 and the carrying region 212, and an outer spacing region 214 that is arranged outside of the carrying region 212 and that is connected to the surrounding lateral surface 23.

Specifically, the optical sensor 2 has a pressure channel 24 formed in an interior thereof. One end of the pressure channel 24 has a first entrance 241 arranged on the outer spacing region 214, and another end of the pressure channel 24 has a second entrance 242 arranged on the inner spacing region 213. The first entrance 241 and the second entrance 242 are arranged adjacent to each other and are respectively located at two opposite sides of the carrying region 212.

It should be noted that each of the first entrance 241 and the second entrance 242 is preferably formed with a waterproof and breathable function, and a length or a volume of the pressure channel 24 should be as small as possible, thereby preventing the formation of the pressure channel 24 from affecting a structural strength of the optical sensor 2. In the present embodiment, the first entrance 241 and the second entrance 242 have a same shape (e.g., a square shape or a circular shape) and have a same aperture D241, D242, and each of the aperture D241 of the first entrance 241 and the aperture D242 of the second entrance 242 is within a range from 0.2 μm to 10 μm, but the present disclosure is not limited thereto.

For example, in other embodiments of the present disclosure not shown in the drawings, when the aperture D241 of the first entrance 241 is within a range from 0.2 μm to 10 μm for providing the waterproof and breathable function, the shapes of the first entrance 241 and the second entrance 242 can be changed according to design requirements, and the aperture D242 of the second entrance 242 can be greater than the aperture D241 of the first entrance 241.

Specifically, the optical sensor 2 in the present embodiment includes a plurality of connection pads 215 that are arranged on the top surface 21 and that are spaced apart from each other. Two ends of each of the metal wires 3 are respectively connected to one of the bonding pads 112 and one of the connection pads 215, so that the substrate 1 and the optical chip 2 are electrically coupled to each other. Moreover, the arrangement of the connection pads 215 can be adjusted or changed according to design requirements.

Figure 5:
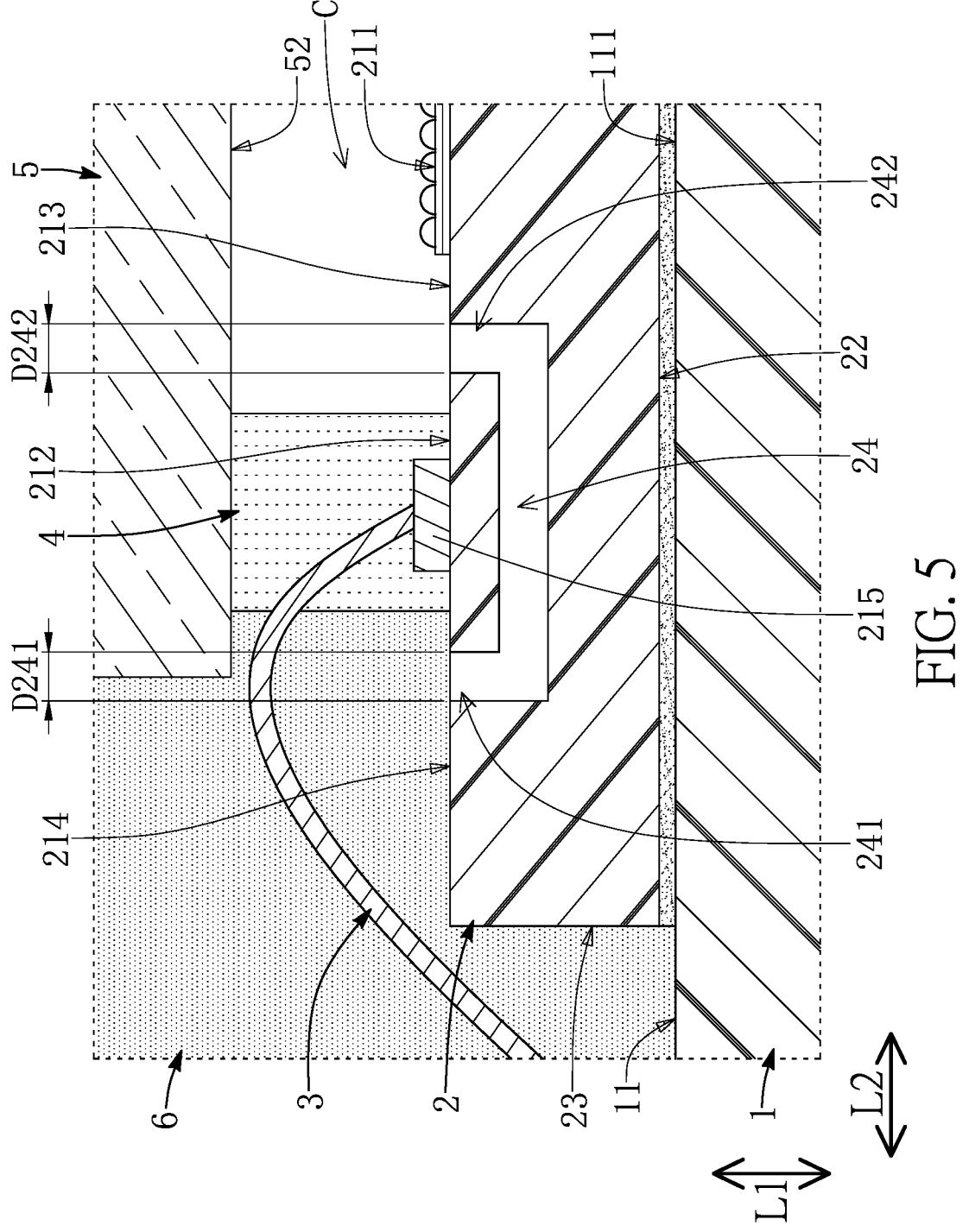
FIG. 5 is a schematic enlarged view showing the part IV of FIG. 3 in another configuration.

For example, as shown in FIG. 2 to FIG. 4, the connection pads 215 are arranged on the outer spacing region 213, each of the metal wires 3 are entirely embedded in the encapsulant 6 (e.g., the ring-shaped supporting layer 4 being located at an inner side of the metal wires 3 and not in contact with any one of the metal wires 3), and the first entrance 241 is substantially located between the carrying region 212 and one of the connection pads 215. Or, as shown in FIG. 5, the connection pads 215 are arranged on the carrying region 212, and each of the metal wires 3 is embedded in the ring-shaped supporting layer 4 and the encapsulant 6.

In addition, the number and positions of the connection pads 215 of the optical chip 2 in the present embodiment correspond to those of the bonding pads 112 of the substrate 1. In other words, the connection pads 215 in the present embodiment are substantially in a ring-shaped arrangement, but the present disclosure is not limited thereto. For example, in other embodiments of the present disclosure not shown in the drawings, the bonding pads 112 of the substrate 1 can be arranged in at least one row, and the connection pads 215 of the optical chip 2 are also arranged in at least one row corresponding in position to the at least one row of the bonding pads 112.

Moreover, each of the outer spacing region 214 and the inner spacing region 213 in the present embodiment has a ring shape, but can be adjusted or changed according to design requirements. In other words, the shapes or the arrangements of the outer spacing region 214 and the inner spacing region 213 have to be configured in a way such as to allow the first entrance 241 and the second entrance 214 to be respectively formed thereon.

As shown in FIG. 2 to FIG. 4, the ring-shaped supporting layer 4 is disposed on the carrying region 212 of the optical chip 2 and surrounds the optical region 211. In other words, the first entrance 241 and the second entrance 242 are respectively located at two opposite sides of the ring-shaped supporting layer 4, and each of the first entrance 241 and the second entrance 242 is preferably spaced apart from the ring-shaped supporting layer 4 by a distance, thereby preventing the ring-shaped supporting layer 4 from extending into the pressure channel 24.

The light-permeable layer 5 in the present embodiment is a transparent and flat glass board, but the present disclosure is not limited thereto. The light-permeable layer 5 has an outer surface 51 and an inner surface 52 that is opposite to the outer surface 51. The light-permeable layer 5 is disposed on the ring-shaped supporting layer 4 through the inner surface 52, so that the light-permeable layer 5, the ring-shaped supporting layer 4, and the top surface 21 of the optical chip 2 jointly define an air chamber C that is in fluid communication with the pressure channel 24. In the present embodiment, the air chamber C is in spatial communication with an external space (not labeled in the drawings) through the pressure channel 24 only.

The encapsulant 6 of the present embodiment is opaque for blocking a visible light from passing therethrough. The encapsulant 6 is a liquid encapsulation and is formed on the upper surface 11 of the substrate 1, and edges of the encapsulant 6 are flush with edges of the substrate 1. However, in other embodiments of the present disclosure not shown in the drawings, the encapsulant 6 can be a molding compound.

Moreover, the optical chip 2, the ring-shaped supporting layer 4, and the light-permeable layer 5 are embedded in the encapsulant 6, and the outer surface 51 of the light-permeable layer 5 arranged away from the substrate 1 is at least partially exposed from the encapsulant 6. The encapsulant 6 encloses the first entrance 241 of the pressure channel 24 and does not flow (or extend) into the pressure channel 24, and the air chamber 24 is enclosed and has a pressure value that can be within a range from 0.9 atm to 1.1 atm.

It should be noted that high-temperature manufacturing steps (e.g., a heating and curing step of the ring-shaped supporting layer 4) of the optical package structure 100 in the present embodiment can be completed before the encapsulant 6 is formed, so that when the manufacturing steps under high temperature conditions are implemented, the pressure value of the air chamber C can be effectively reduced through the pressure channel 24 for maintaining a difference between the pressure value of the air chamber C and a pressure value of the external space to be less than 0.1 atm. For example, the difference can be controlled to be less than 0.01 atm, such that the pressure value of the air chamber C is within a range from 0.99 atm to 1.01 atm.

In summary, the optical chip 2 of the optical package structure 100 in the present embodiment is formed with the pressure channel 24 having a specific arrangement, so that when the manufacturing steps under high temperature conditions are implemented, the ring-shaped supporting layer 4 can be effectively prevented from being affected by the air chamber to avoid deformation, thereby increasing the product yield and reliability of the optical package structure 100.

Second Embodiment

Figure 6:
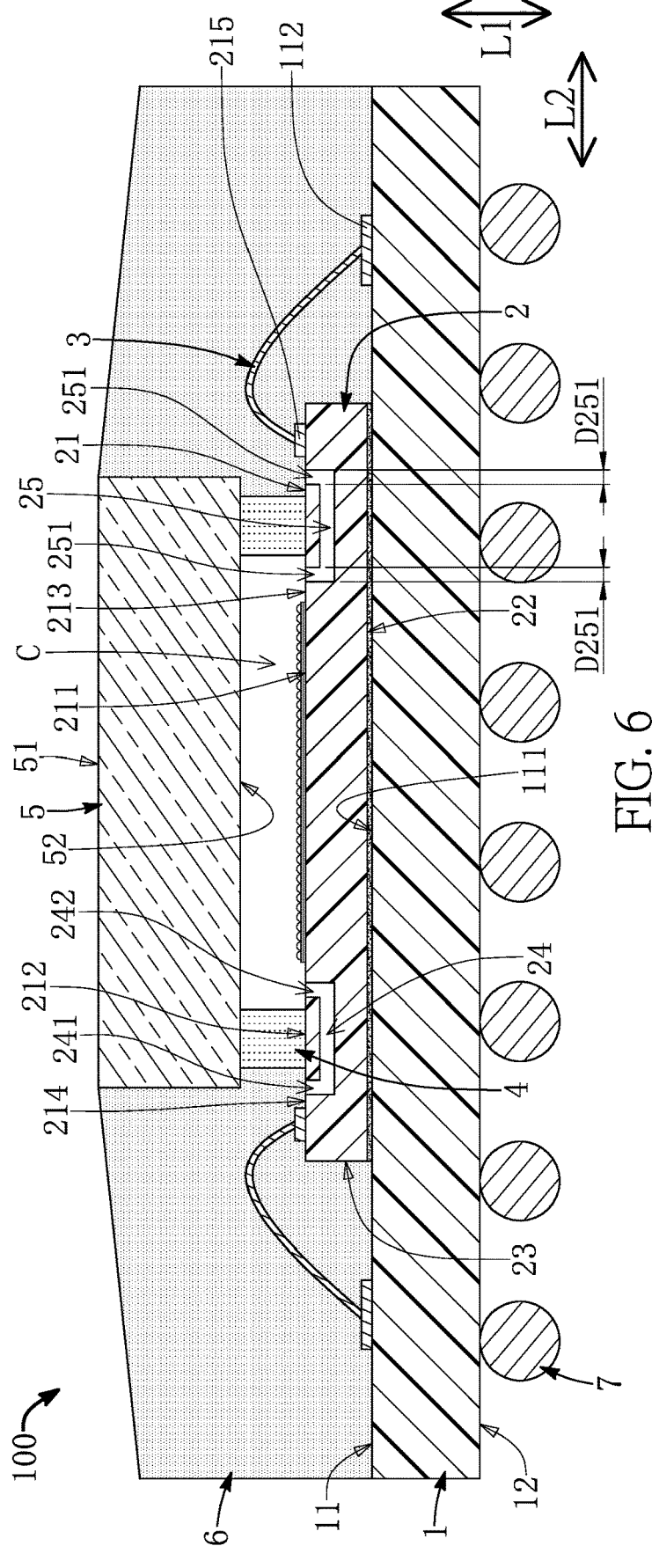
FIG. 6 is a schematic cross-sectional view of the optical package structure according to a second embodiment of the present disclosure.

Referring to FIG. 6, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the optical chip 2 further has at least one auxiliary channel 25 formed in the interior thereof, and the at least one auxiliary channel 25 has two channel openings 251 that are respectively arranged on two ends thereof and that are respectively arranged on the outer spacing region 214 and the inner spacing region 213. One of the two channel openings 251 arranged on the outer spacing region 214 has an aperture D251 being within a range from 0.2 μm to 10 μm and is enclosed by the encapsulant 6. Another of the two channel openings 251 arranged on the inner spacing region 213 also has an aperture D251 being within a range from 0.2 μm to 10 μm.

Specifically, the pressure channel 24 and the at least one auxiliary channel 25 are in a symmetrical arrangement with respect to the optical region 211. In the present embodiment, a quantity of the at least one auxiliary channel 25 is one, and the first entrance 241, the second entrance 242, and the two channel openings 251 are arranged along a straight direction L2 (or a straight line) perpendicular to the predetermined direction L1 (e.g., the first entrance 241, the second entrance 242 are arranged at one side of the optical region 211, and the two channel openings 251 are arranged at an opposite side of the optical region 211), but the present disclosure is not limited thereto.

Third Embodiment

Referring to FIG. 7 to FIG. 11, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the first entrance 241 of the pressure channel 24 is arranged on the surrounding lateral surface 23 and has an aperture being within a range from 0.2 μm to 10 μm. The encapsulant 6 encloses the first entrance 241 of the pressure channel 24 and does not flow (or extend) into the pressure channel 24, and the air chamber C is enclosed. Accordingly, the pressure value of the air chamber C in the present embodiment is within a range from 0.9 atm to 1.1 atm, and is preferably within a range from 0.99 atm to 1.01 atm.

Figure 7:
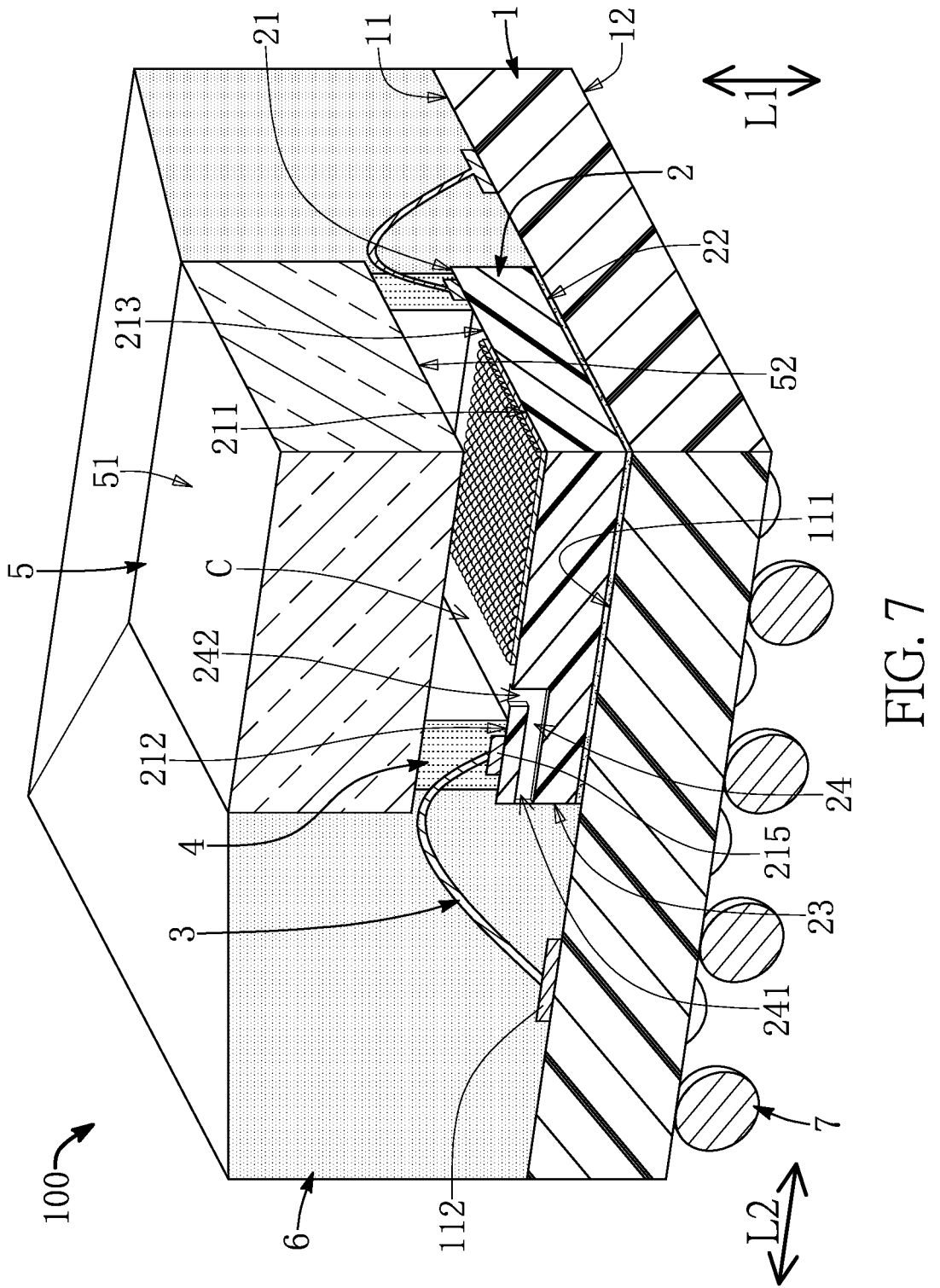
FIG. 7 is a perspective cross-sectional view of the optical package structure according to a third embodiment of the present disclosure.
Figure 8:
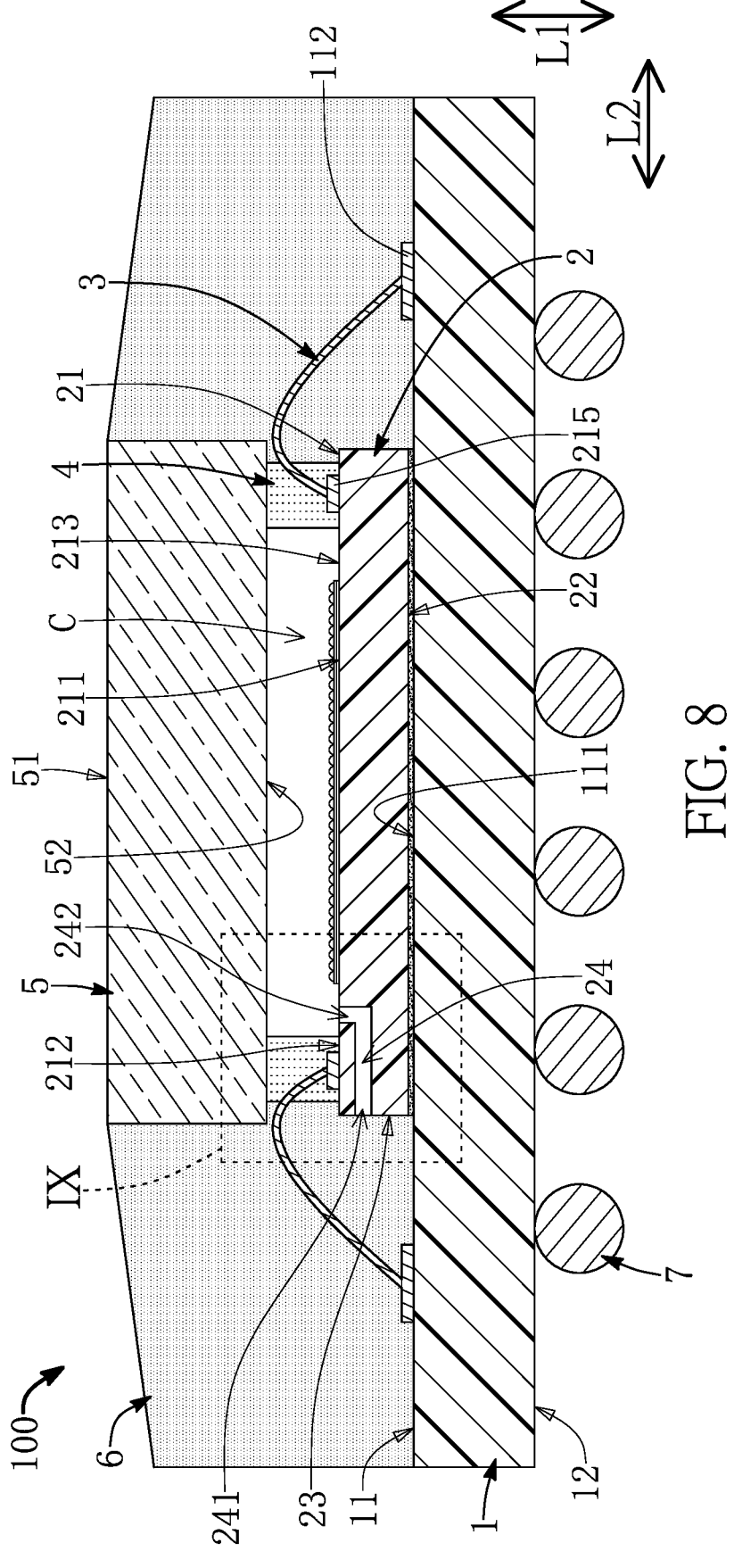
FIG. 8 is a planar cross-sectional view of the optical package structure according to the third embodiment of the present disclosure.
Figure 9:
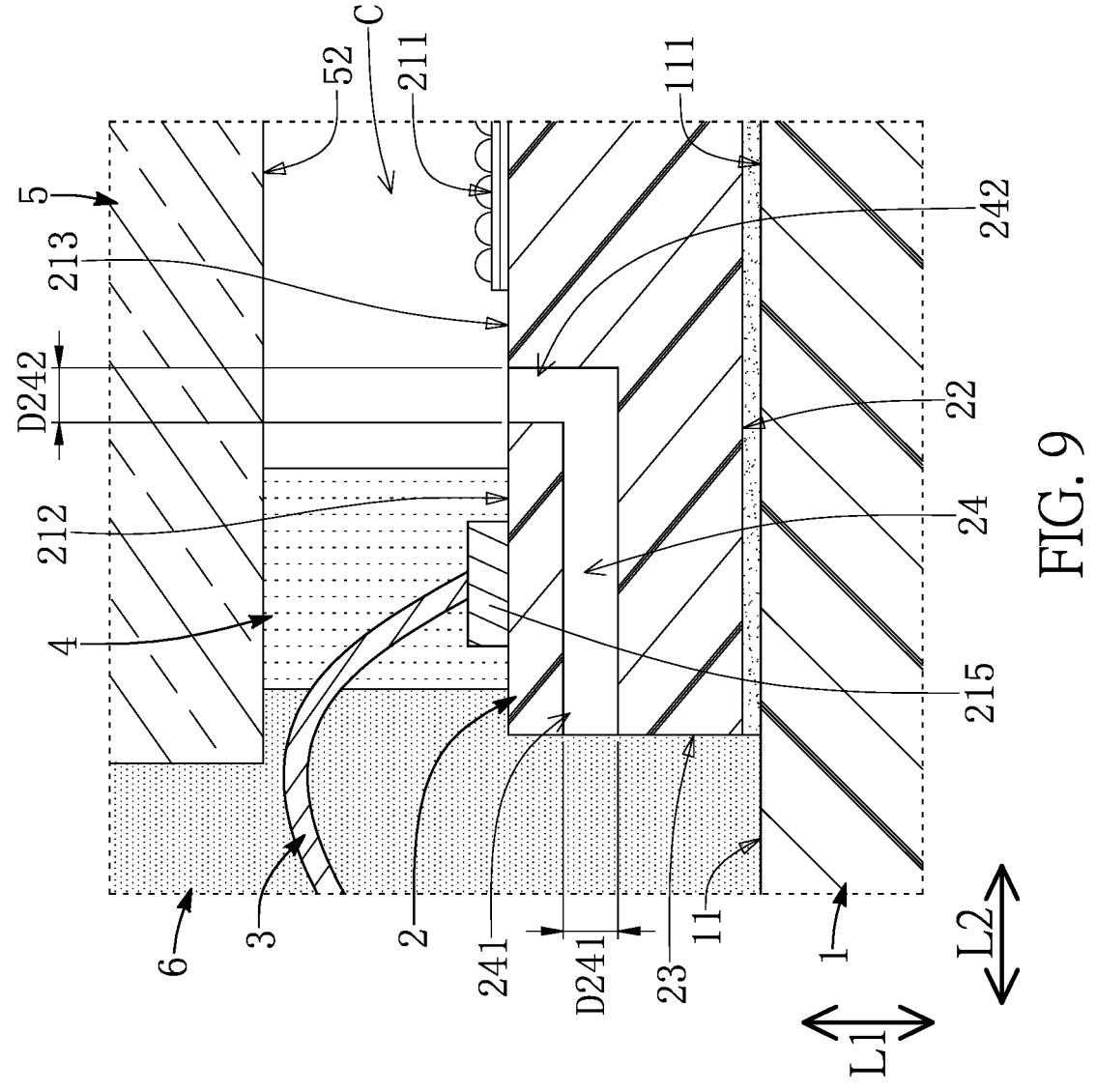
FIG. 9 is a schematic enlarged view of part IX of FIG. 8.
Figure 10:
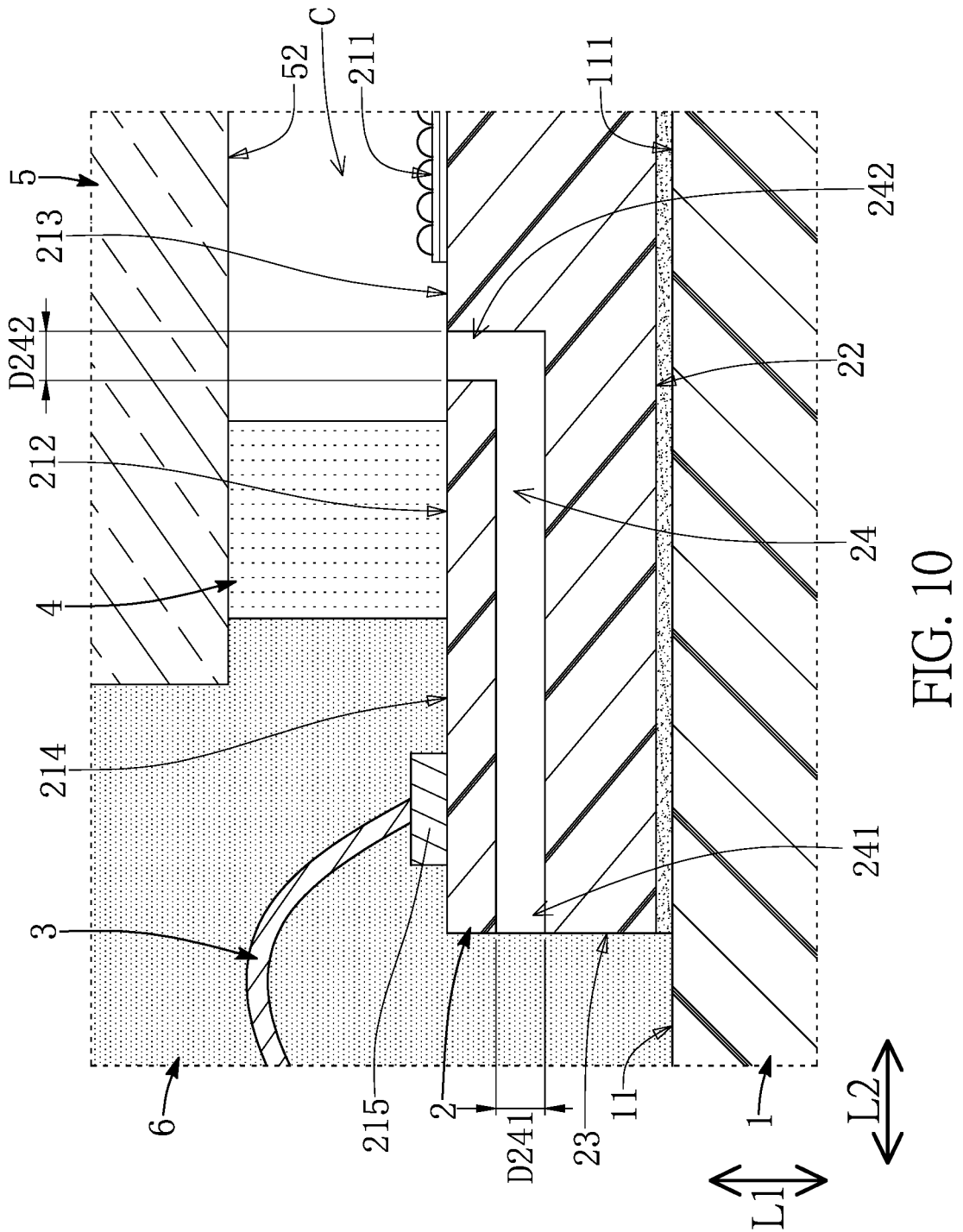
FIG. 10 is a schematic enlarged view showing the part IX of FIG. 9 in another configuration.

Specifically, as shown in FIG. 10, the connection pads 215 of the optical chip 2 can be arranged on the outer spacing region 214, and each of the metal wires 3 are entirely embedded in the encapsulant 6. Or, as shown in FIG. 7 to FIG. 9, the connection pads 215 of the optical chip 2 can be arranged on the carrying region 212, each of the metal wires 3 are entirely embedded in the ring-shaped supporting layer 4 and the encapsulant 6, and the peripheral edge of the optical chip 2 is arranged on (or substantially overlapped with) an edge of the carrying region 212, thereby enabling the optical package structure 200 to encapsulate the optical chip 2 having a smaller size.

Figure 11:
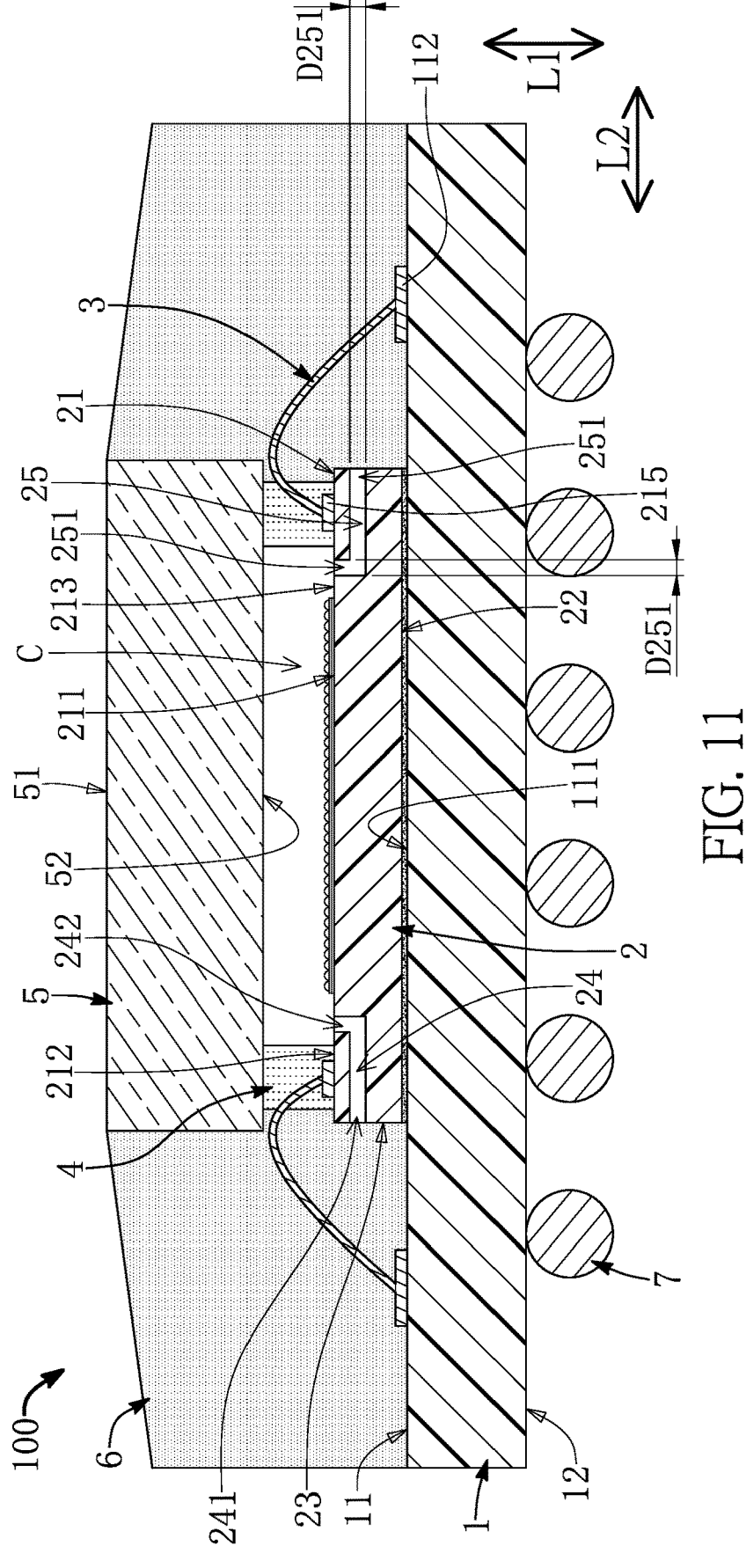
FIG. 11 is a planar cross-sectional view of the optical package structure in another configuration according to the third embodiment of the present disclosure.

In addition, as shown in FIG. 11, in the at least one auxiliary channel 25 formed in the optical chip 2, one of the two channel openings 251 is arranged on the surrounding lateral surface 23 and enclosed by the encapsulant 6 and has an aperture D251 being within a range from 0.2 μm to 10 μm, and another of the two channel openings 251 is arranged on the inner spacing region 213.

Beneficial Effects of the Embodiments

In conclusion, the optical chip of the optical package structure in the present disclosure is formed with the pressure channel having a specific arrangement, so that when the manufacturing steps under high temperature conditions are implemented, the ring-shaped supporting layer can be effectively prevented from being affected by the air chamber to avoid deformation, thereby increasing the product yield and reliability of the optical package structure.

Moreover, the optical package structure in the present disclosure can further have at least one auxiliary channel, such that when the manufacturing steps under high temperature conditions for the optical package structure are implemented before forming the encapsulant, the pressure value of the air chamber can be quickly reduced through the pressure channel and the at least one auxiliary channel.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical package structure, comprising:
   a substrate;
   an optical chip disposed on and electrically coupled to the substrate, wherein a top surface of the optical chip includes:
      an optical region;
      a carrying region surrounding the optical region;
      an inner spacing region arranged between the optical region and the carrying region; and
      an outer spacing region arranged outside of the carrying region;
      wherein the optical chip has a pressure channel formed in an interior thereof, and wherein one end of the pressure channel has a first entrance that is arranged on the outer spacing region and that has an aperture being within a range from 0.2 μm to 10 μm, and another end of the pressure channel has a second entrance that is arranged on the inner spacing region;
   a ring-shaped supporting layer disposed on the carrying region of the optical chip and surrounding the optical region;
   a light-permeable layer disposed on the ring-shaped supporting layer, wherein the light-permeable layer, the ring-shaped supporting layer, and the top surface of the optical chip jointly define an air chamber being in fluid communication with the pressure channel; and
   an encapsulant formed on the substrate, wherein the optical chip, the ring-shaped supporting layer, and the light-permeable layer are embedded in the encapsulant, and an outer surface of the light-permeable layer arranged away from the substrate is at least partially exposed from the encapsulant, and wherein the encapsulant encloses the first entrance of the pressure channel and does not extend into the pressure channel, and the air chamber is enclosed.

2. The optical package structure according to claim 1, wherein a pressure value of the air chamber is within a range from 0.9 atm to 1.1 atm.

3. The optical package structure according to claim 1, wherein an aperture of the second entrance is within a range from 0.2 μm to 10 μm.

4. The optical package structure according to claim 1, wherein the first entrance and the second entrance are arranged adjacent to each other and are respectively located at two opposite sides of the ring-shaped supporting layer.

5. The optical package structure according to claim 1, further comprising a plurality of metal wires entirely embedded in the encapsulant, wherein the substrate includes a plurality of bonding pads, and the optical chip includes a plurality of connection pads arranged on the outer spacing region, and wherein two ends of each of the metal wires are respectively connected to one of the bonding pads and one of the connection pads, so that the substrate and the optical chip are electrically coupled to each other.

6. The optical package structure according to claim 5, wherein the first entrance is arranged between the carrying region and one of the connection pads.

7. The optical package structure according to claim 1, further comprising a plurality of metal wires, wherein the substrate includes a plurality of bonding pads, and the optical chip includes a plurality of connection pads arranged on the carrying region, wherein two ends of each of the metal wires are respectively connected to one of the bonding pads and one of the connection pads, so that the substrate and the optical chip are electrically coupled to each other, and wherein each of the metal wires is entirely embedded in the ring-shaped supporting layer and the encapsulant.

8. The optical package structure according to claim 1, wherein the optical chip has at least one auxiliary channel formed in the interior thereof, and the at least one auxiliary channel has two channel openings respectively arranged on two ends thereof, and wherein one of the two channel openings is arranged on the outer spacing region and enclosed by the encapsulant and has an aperture being within a range from 0.2 μm to 10 μm, and another of the two channel openings is arranged on the inner spacing region.

9. The optical package structure according to claim 8, wherein the pressure channel and the at least one auxiliary channel are in a symmetrical arrangement with respect to the optical region.

10. The optical package structure according to claim 8, wherein a quantity of the at least one auxiliary channel is one, and the first entrance, the second entrance, and the two channel openings are arranged along a straight line.

11. An optical package structure, comprising:
a substrate;
an optical chip disposed on and electrically coupled to the substrate, wherein the optical chip includes a top surface and a surrounding lateral surface that is connected to a peripheral edge of the top surface, and wherein the top surface includes:
an optical region;
a carrying region surrounding the optical region; and
an inner spacing region arranged between the optical region and the carrying region;

wherein the optical chip has a pressure channel formed in an interior thereof, and wherein one end of the pressure channel has a first entrance that is arranged on the surrounding lateral surface and that has an aperture being within a range from 0.2 μm to 10 μm, and another end of the pressure channel has a second entrance that is arranged on the inner spacing region;
a ring-shaped supporting layer disposed on the carrying region of the optical chip and surrounding the optical region;
a light-permeable layer disposed on the ring-shaped supporting layer, wherein the light-permeable layer, the ring-shaped supporting layer, and the top surface of the optical chip jointly define an air chamber being in fluid communication with the pressure channel; and
an encapsulant formed on the substrate, wherein the optical chip, the ring-shaped supporting layer, and the light-permeable layer are embedded in the encapsulant, and an outer surface of the light-permeable layer arranged away from the substrate is at least partially exposed from the encapsulant, and wherein the encapsulant encloses the first entrance of the pressure channel and does not extend into the pressure channel, and the air chamber is enclosed.

12. The optical package structure according to claim 11, wherein a pressure value of the air chamber is within a range from 0.9 atm to 1.1 atm.

13. The optical package structure according to claim 11, further comprising a plurality of metal wires, wherein the substrate includes a plurality of bonding pads, and the optical chip includes a plurality of connection pads arranged on the carrying region, wherein two ends of each of the metal wires are respectively connected to one of the bonding pads and one of the connection pads, so that the substrate and the optical chip are electrically coupled to each other, and wherein each of the metal wires is entirely embedded in the ring-shaped supporting layer and the encapsulant.

14. The optical package structure according to claim 13, wherein the peripheral edge of the top surface is arranged on an edge of the carrying region.

15. The optical package structure according to claim 11, further comprising a plurality of metal wires entirely embedded in the encapsulant, wherein the substrate includes a plurality of bonding pads, and the top surface of the optical chip includes an outer spacing region arranged outside of the carrying region and a plurality of connection pads that are arranged on the outer spacing region, and wherein two ends of each of the metal wires are respectively connected to one of the bonding pads and one of the connection pads, so that the substrate and the optical chip are electrically coupled to each other.

16. The optical package structure according to claim 11, wherein the optical chip has at least one auxiliary channel formed in the interior thereof, and the at least one auxiliary channel has two channel openings respectively arranged on two ends thereof, and wherein one of the two channel openings is arranged on the surrounding lateral surface and enclosed by the encapsulant and has an aperture being within a range from 0.2 μm to 10 μm, and another of the two channel openings is arranged on the inner spacing region.

17. An optical chip of an optical package structure, comprising:
a top surface including:
an optical region;
a carrying region surrounding the optical region;
an inner spacing region arranged between the optical region and the carrying region; and an outer spacing region arranged outside of the carrying region; and a surrounding lateral surface; wherein the optical chip has a pressure channel formed in an interior thereof, and wherein one end of the pressure channel has a first entrance that is arranged on one of the outer spacing region and the surrounding lateral surface and that has an aperture being within a range from 0.2 μm to 10 μm, and another end of the pressure channel has a second entrance that is arranged on the inner spacing region.

18. The optical sensor according to claim 17, further comprising at least one auxiliary channel formed in the interior thereof, wherein the at least one auxiliary channel has two channel openings respectively arranged on two ends thereof, and wherein one of the two channel openings is arranged on one of the outer spacing region and the surrounding lateral surface and has an aperture being within a range from 0.2 μm to 10 μm, and another of the two channel openings is arranged on the inner spacing region.

19. The optical sensor according to claim 18, wherein the pressure channel and the at least one auxiliary channel are in a symmetrical arrangement with respect to the optical region.

20. The optical sensor according to claim 18, wherein a quantity of the at least one auxiliary channel is one, and the first entrance, the second entrance, and the two channel openings are arranged along a straight line.

* * * * *